(12) United States Patent
Susa

(10) Patent No.: US 10,629,415 B2
(45) Date of Patent: Apr. 21, 2020

(54) SUBSTRATE PROCESSING APPARATUS AND METHOD FOR PROCESSING SUBSTRATE

(71) Applicant: ASM IP Holding B.V., Almere (NL)

(72) Inventor: Yoshio Susa, Tama (JP)

(73) Assignee: ASM IP Holding B.V., Almere (NL)

( * ) Notice: Subject to any disclaimer, the term of this patent is extended or adjusted under 35 U.S.C. 154(b) by 134 days.

(21) Appl. No.: 15/890,850

(22) Filed: Feb. 7, 2018

(65) Prior Publication Data

US 2018/0286638 A1  Oct. 4, 2018

Related U.S. Application Data

(63) Continuation-in-part of application No. 15/471,376, filed on Mar. 28, 2017, now abandoned.

(51) Int. Cl.
*H01J 37/32* (2006.01)

(52) U.S. Cl.
CPC .... *H01J 37/32541* (2013.01); *H01J 37/3244* (2013.01); *H01J 37/32082* (2013.01); *H01J 37/32697* (2013.01)

(58) Field of Classification Search
None
See application file for complete search history.

(56) References Cited

FOREIGN PATENT DOCUMENTS

| JP | H06-023240 U | 3/1994 |
|---|---|---|
| JP | H11-158621 A | 6/1999 |
| JP | 2004-165198 A | 6/2004 |
| JP | 2005-051010 A | 2/2005 |
| JP | 2009-152603 A | 7/2009 |
| JP | 2016-122654 A | 7/2016 |

*Primary Examiner* — Joseph A Miller, Jr.
(74) *Attorney, Agent, or Firm* — Studebaker & Brackett PC

(57) ABSTRACT

A substrate processing apparatus includes a chamber, a susceptor provided in the chamber, a shower plate having a plate part provided with a plurality of through holes and formed of a conductor, a ring-shaped part connected to an outer edge of the plate part, surrounding the plate part and formed of a conductor and a lead wire embedded in the ring-shaped part and surrounding the plate part and the susceptor in plan view, the shower plate being provided so as to face the susceptor in the chamber, and a DC power supply that supplies a direct current to the lead wire.

6 Claims, 8 Drawing Sheets

SUBSTRATE PROCESSING APPARATUS AND METHOD FOR PROCESSING SUBSTRATE

BACKGROUND

Field

Examples are described which relate to a substrate processing apparatus and a method for processing the substrate.

Background Art

JP2009-152603 discloses a plasma CVD apparatus having a cleaning function has an improved shower plate with holes having a uniform cross-sectional area to yield a high cleaning rate. The shower plate may serve as an electrode, and may have an electrically conductive extension connected to a power source. The shower plate, through which both cleaning gas and reaction source gas flow, may include a hole machined surface area with a size different than conventionally used to ensure a good film thickness uniformity during a deposition process. The size of the hole machined surface area may vary based on the size of a substrate to be processed, or the size of the entire surface of the shower plate.

JP2016-122654 discloses a method and an apparatus for plasma processing of substrates. In this disclosure, a processing chamber has a substrate support and a lid assembly facing the substrate support. The lid assembly has a plasma source that includes an inductive coil disposed within a conductive plate, and may include nested conductive rings. The inductive coil is substantially coplanar with the conductive plate, and insulated from the conductive plate by an insulator that fits within a channel formed in the conductive plate or nests within the conductive rings. A field concentrator is provided around the inductive coil, and insulated from the inductive coil by isolators. The plasma source is supported from a conductive support plate. A gas distributor supplies gas to the chamber through a central opening of the support plate and to the plasma source from a conduit disposed through the conductive plate.

The shower plate in JP2009-152603 is an electrode of a parallel planar plasma CVD apparatus. In the apparatus configuration of JP2009-152603, relative to a plasma density directly below a central part of the shower plate, a plasma density directly below the outside of the shower plate that surrounds the central part sometimes decreases. This results in a problem that it is not possible to perform uniform plasma processing on the entire surface of the substrate. For example, film formation becomes insufficient at and around an outer edge of a wafer, and in-plane uniformity of film thickness and film quality become degraded.

SUMMARY

Some examples described may address the above-described problems. Some examples described herein may provide a shower plate, a substrate processing apparatus and a method for processing a substrate capable of applying uniform plasma processing to the substrate.

In some examples, a substrate processing apparatus includes a chamber, a susceptor provided in the chamber, a shower plate having a plate part provided with a plurality of through holes and formed of a conductor, a ring-shaped part connected to an outer edge of the plate part, surrounding the plate part and formed of a conductor and a lead wire embedded in the ring-shaped part and surrounding the plate part and the susceptor in plan view, the shower plate being provided so as to face the susceptor in the chamber, and a DC power supply that supplies a direct current to the lead wire.

In some examples, a method for processing a substrate includes providing the substrate on a susceptor, and applying RF power to a shower plate provided on the susceptor, the shower plate having a plate part provided with a plurality of through holes and formed of a conductor, and a ring-shaped part connected to an outer edge of the plate part, surrounding the plate part and formed of a conductor, supplying a gas onto the substrate via the plurality of through holes and thereby generating plasma on the substrate. In applying RF power, a DC current is made to flow through a lead wire embedded in the ring-shaped part and surrounding the plate part in plan view or a susceptor inner lead wire embedded in the susceptor and provided to be ring-shaped in plan view along an outer edge of the susceptor, thereby forming a magnetic field directly above an outer edge of the substrate.

In some examples, a substrate processing apparatus includes a chamber, a susceptor provided in the chamber, a shower plate that includes a plate part provided with a plurality of through holes and formed of a conductor, and a ring-shaped part connected to an outer edge of the plate part, surrounding the plate part and formed of a conductor, the shower plate being provided so as to face the susceptor in the chamber, a susceptor inner lead wire embedded in the susceptor and provided to be ring-shaped in plan view along an outer edge of the susceptor, and a DC power supply that supplies a DC current to the susceptor inner lead wire.

DETAILED DESCRIPTION

Figure 1:
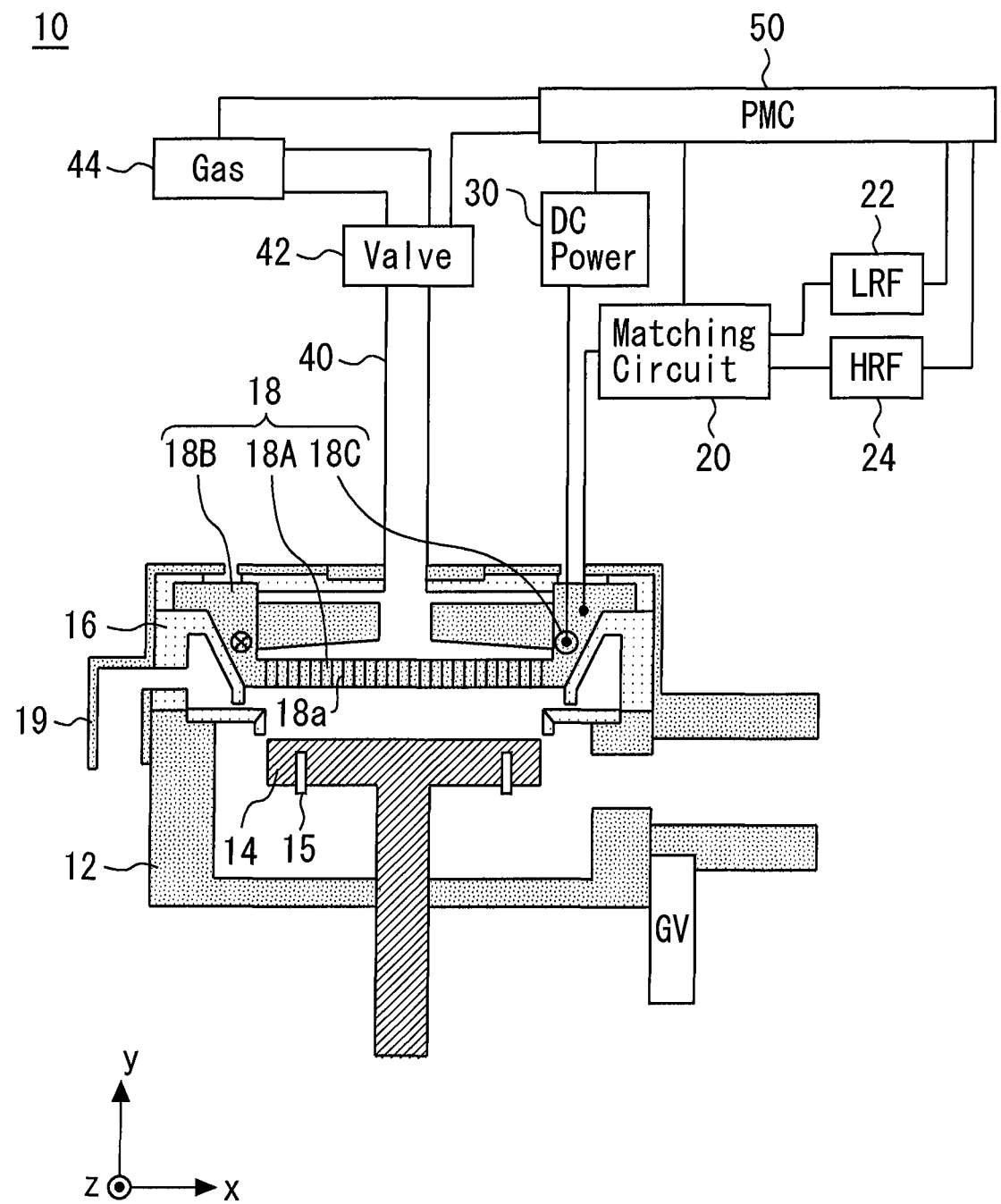
FIG. 1 is a cross-sectional view of a substrate processing apparatus.

A shower plate, a substrate processing apparatus and a method for processing a substrate will be described with reference to the accompanying drawings. The same or corresponding components will be assigned the same reference numerals and duplicate description may be omitted.

FIG. 1 is a cross-sectional view of a substrate processing apparatus 10. The substrate processing apparatus 10 is a parallel planar plasma processing apparatus. The substrate processing apparatus 10 is provided with a chamber 12. The chamber 12 is called a "reactor chamber." A susceptor 14 is provided in the chamber 12. The susceptor 14 is a part on which a substrate is mounted. In some examples, a resistance heating apparatus is embedded in the susceptor 14. The susceptor 14 may be electrically grounded. The susceptor 14 is provided with susceptor pins 15 protruding from the susceptor 14 or housed in the susceptor 14 so as to be used to lift/lower the substrate.

An exhaust duct 16 formed of, for example, an insulator is provided above the chamber 12. The exhaust duct 16 is formed into a ring shape so as to surround the susceptor 14 in plan view. A gas to be used for substrate processing is guided into the exhaust duct 16, then passes through an exhaust pipe 19 and is exhausted to the outside.

A shower plate 18 is provided above the exhaust duct 16. The shower plate 18 is provided with a plate part 18A, a ring-shaped part 18B and a lead wire 18C. The plate part 18A is a conductor provided with a plurality of through holes 18a. The through holes 18a penetrate the plate part 18A in a y-axis direction. The ring-shaped part 18B is a conductor connected to an outer edge of the plate part 18A and surrounding the plate part 18A. The plate part 18A and the ring-shaped part 18B are made of aluminum or an aluminum alloy or another appropriate metal. The lead wire 18C is embedded in the ring-shaped part 18B. The lead wire 18C surrounds the plate part 18A in plan view. The lead wire 18C may surrounds the susceptor 14 in plan view. The lead wire 18C may be covered with an insulating coat so as to be electrically insulated from the ring-shaped part 18B.

In the chamber 12, the susceptor 14 and the shower plate 18 face each other. The shower plate 18 and the susceptor 14 provide a structure with a pair of parallel flat plates. That is, the shower plate 18 and the susceptor 14 provide parallel planar electrodes.

In order to generate plasma, high frequency power supplies 22 and 24 are electrically connected to the plate part 18A and the ring-shaped part 18B via a matching circuit 20. The high frequency power supplies 22 and 24 supply RF power to the plate part 18A and the ring-shaped part 18B. The high frequency power supplies 22 and 24 apply electric power at a frequency of, for example, several hundreds of kHz to several tens of MHz to the plate part 18A and the ring-shaped part 18B. To improve controllability of film quality, the high frequency power supply 22 may supplies a low frequency component and the high frequency power supply 24 may supplies a high frequency component.

Figure 2:
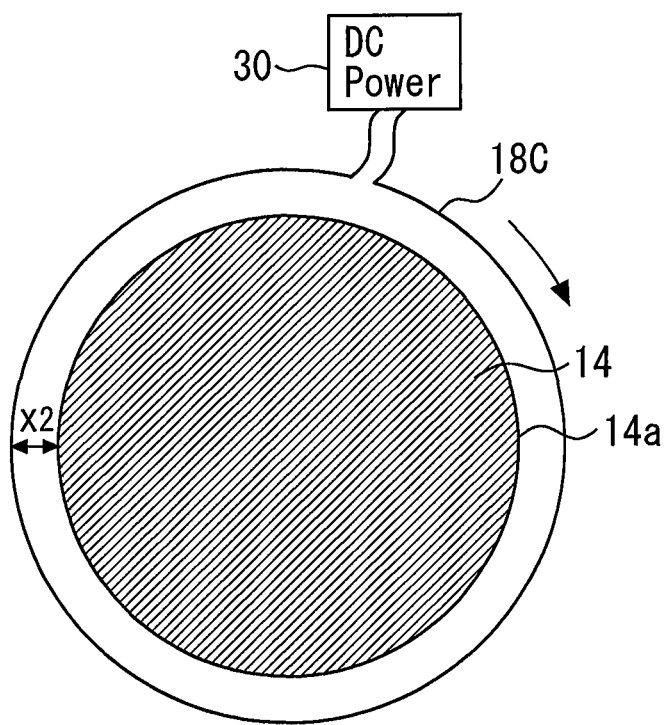
FIG. 2 is a plan view of the lead wire and the susceptor.

A DC power supply 30 is connected to the lead wire 18C to supply a direct current to the lead wire 18C. The DC power supply 30 supplies a direct current of, for example, on the order of 1 A to the lead wire 18C. FIG. 2 is a plan view of the lead wire 18C and the susceptor 14. The lead wire 18C is provided in a ring shape so as to surround the susceptor 14. A distance X2 between the lead wire 18C and an outer edge 14a of the susceptor 14 is, for example, on the order of 5 to 10 mm. For this reason, the lead wire 18C is located 5 to 10 mm outside the outer edge 14a of the susceptor 14. An arrow in FIG. 2 denotes a direction of direct current flow of the lead wire 18C. The DC power supply 30 causes a direct current to flow through the lead wire 18C in a clockwise direction as indicated by the arrow.

Now, FIG. 1 will be described again. A gas supply pipe 40 is connected to a top of the plate part 18A. A valve 42 is provided at some midpoint of the gas supply pipe 40. The valve 42 can open/close the gas supply pipe 40. Furthermore, a gas source 44 that supplies a gas is connected to the gas supply pipe 40. The gas source 44 supplies various gases to be used for processing of the substrate. Examples of such gas include a material gas, a reaction gas and a purge gas. The gas source 44 may supply all kinds of known gases to be used to generate plasma. A gas is supplied to a position directly above the susceptor 14 from the gas source 44 through the gas supply pipe 40, a space directly above the plate part 18A and the through holes 18a.

The high frequency power supplies 22 and 24, the matching circuit 20, the DC power supply 30, the valve 42 and the gas source 44 are connected to a PMC (process module controller) 50. The PMC 50 controls operations of the high frequency power supplies 22 and 24, the matching circuit 20, the DC power supply 30, the valve 42 and the gas source 44 based on a prescribed recipe.

Figure 3:
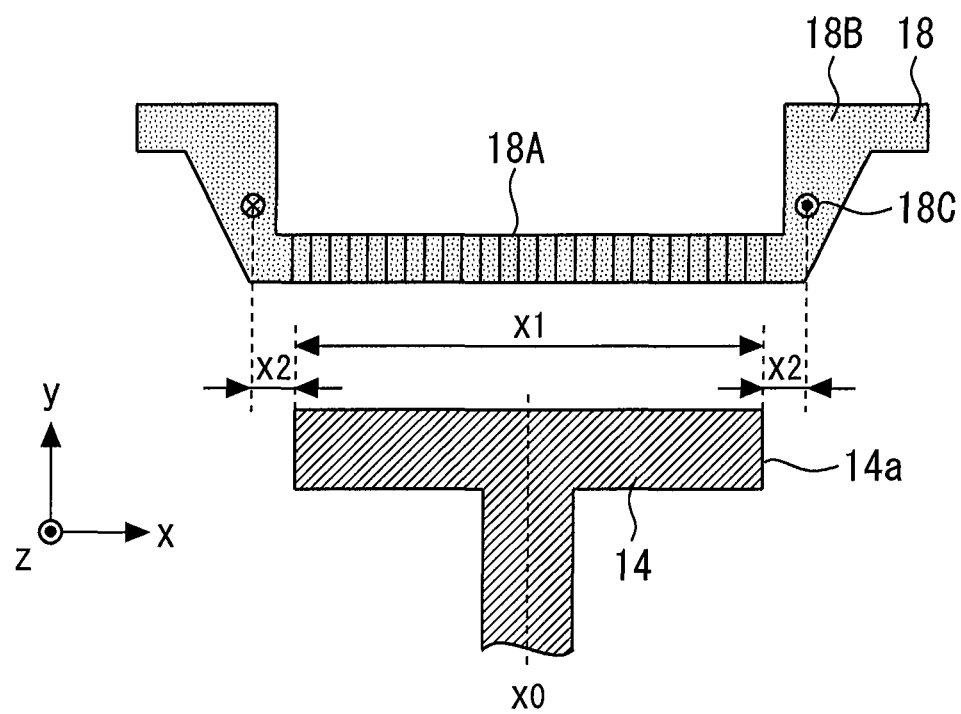
FIG. 3 is an enlarged cross-sectional view of the shower plate and the susceptor.

FIG. 3 is an enlarged view of the shower plate 18 and the susceptor 14. When processing a 300 mm wafer, a width X1 of the susceptor 14 is, for example, 302 to 304 mm. A distance X2 between the outer edge 14a of the susceptor 14 and the lead wire 18C in a horizontal direction is, for example, on the order of 5 to 10 mm. Therefore, the lead wire 18C is provided not directly above the susceptor 14 but outside a position directly above the susceptor 14. In FIG. 3, the lead wires 18C are located one on each of left and right sides of the ring-shaped part 18B. A direct current flows through the right-side lead wire 18C toward the front direction of the figure and flows through the left-side lead wire 18C toward the back direction of the figure.

Figure 4:
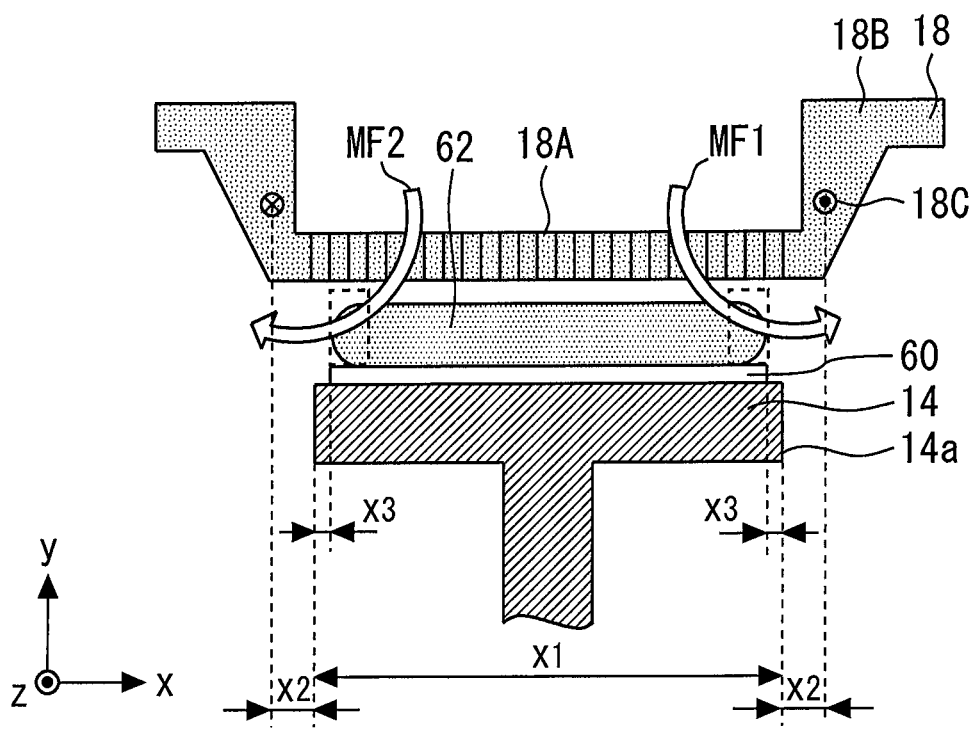
FIG. 4 is a cross-sectional view of the shower plate and the susceptor with plasma.

A method for processing a substrate using the substrate processing apparatus 10 will be described. FIG. 4 is a cross-sectional view of the shower plate 18 and the susceptor 14 where plasma processing on a substrate is in progress. First, a substrate 60 is mounted on the susceptor 14. This step is called a "mounting step." The substrate 60 is, for example, a 300 mm wafer. A distance between an outer edge of the substrate 60 and the outer edge 14a of the susceptor 14 in the horizontal direction is, for example, on the order of 1 to 2 mm. Therefore, a distance X3 in FIG. 4 is, for example, 1 to 2 mm.

Next, the process proceeds to a plasma step. In the plasma step, plasma 62 is generated above the substrate 60 by supplying a gas onto the substrate 60 via the plurality of through holes 18a while applying RF power to the plate part 18A and the ring-shaped part 18B. More specifically, the PMC 50 operates the high frequency power supplies 22 and 24, and thereby applies RF power to the plate part 18A and the ring-shaped part 18B. Furthermore, the PMC 50 controls the gas source 44 and the valve 42, and thereby supplies a prescribed gas onto the substrate 60.

In the plasma step, a direct current is made to flow through the lead wire 18C in addition to the above-described application of RF power and gas supply. More specifically, a direct current of on the order of several A is made to flow from the DC power supply 30 into the lead wire 18C. The direct current flowing through the lead wire 18C is, for example, 1 A. Then, a direct current in a positive z-axis direction flows through the right-side lead wire 18C and a direct current in a negative z-axis direction flows through the left-side lead wire 18C in FIG. 4. A magnetic field MF1 is formed by the direct current flowing through the right-side lead wire 18C and a magnetic field MF2 is formed by the direct current flowing through the left-side lead wire 18C. The direction of the magnetic field MF1 is a counterclockwise direction and the direction of the magnetic field MF2 is a clockwise direction.

Thus, it is possible to form a magnetic field directly above the outer edge of the substrate 60 by passing a direct current through the lead wire 18C. This magnetic field allows a magnetic force to be exerted to the plasma 62. More specifically, the magnetic field provided is stronger directly above the outer edge of the substrate 60 and its vicinity than at a position directly above the center of the substrate 60. Furthermore, the lead wire 18C is located by a distance X2+X3 outside the outer edge of the substrate 60. Thus, it is possible to form a magnetic field having a vertically downward component directly above the outer edge of the substrate 60 by passing a direct current through the lead wire 18C. As is shown by the magnetic fields MF1 and MF2 in FIG. 4, the magnetic field generated directly above the outer edge of the substrate 60 by passing the direct current through the lead wire 18C has a "horizontal component" and a "vertical component." The "horizontal component" is a component in a direction opposite to the center of the substrate. The "vertical component" is a component in a vertically downward direction.

Figure 5:
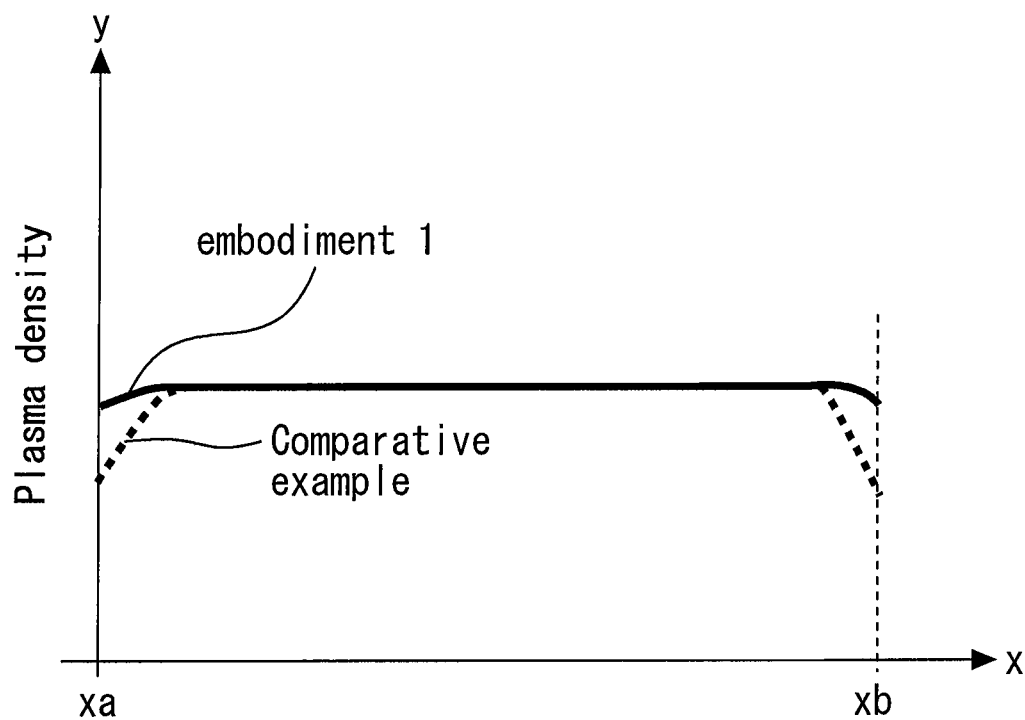
FIG. 5 is a diagram illustrating a plasma density.

FIG. 5 is a diagram illustrating a plasma density. A reference character "xa" denotes a position directly above a left end of the substrate 60 and reference character "xb" denotes a position directly above a right end of the substrate 60. When the substrate 60 is a 300 mm wafer, the distance from "xa" to "xb" is 300 mm. The vertical axis in FIG. 5 shows a plasma density. In FIG. 5, a solid line shows a plasma density generated at the substrate processing apparatus 10 according to the example and a broken line shows a plasma density according to a comparative example. The substrate processing apparatus according to the comparative example has a configuration in which the lead wire 18C is removed from the substrate processing apparatus 10. In the case of the comparative example, a significant decrease in the plasma density is observed at a position directly above an end portion compared to a position directly above the center of the substrate. This is assumed to be mainly attributable to the fact that electrons located in the vicinity of a position directly above the outer edge of the substrate at the beginning of plasma generation are attracted to cations existing directly above the center of the substrate at a high density and moved toward directly above the center of the substrate.

In contrast, according to the substrate processing apparatus 10, a magnetic field is formed mainly in a region directly above the outer edge of the substrate 60 by passing a direct current through the lead wire 18C. This magnetic field causes electrons to move so as to wind around magnetic lines of force. This motion is called "cyclotron motion." Causing the magnetic field to trap electrons in the region directly above the outer edge of the substrate 60 prevents electrons from being attracted to positions directly above the center of the substrate 60. Note that the outer edge of the substrate 60 has a certain width and the "region directly above the outer edge" has a doughnut-shaped region having a certain width in plan view. The "region directly above the outer edge" is, for example, a region enclosed by the broken line in FIG. 4.

Thus, by preventing electrons in the region directly above the outer edge of the substrate 60 from being attracted to positions directly above the center of the substrate 60, it is possible to prevent the plasma density in the region directly above the outer edge of the substrate from decreasing. It is thereby possible to keep substantially constant the plasma density directly above the substrate 60. Thus, uniform plasma processing may be applied to the substrate 60. Moreover, the shower plate 18 according to the example may be simply manufactured by only providing the lead wire 18C for the shower plate having two conventionally known functions of gas supply and RF application.

The magnetic field provided in the region directly above the outer edge of the substrate 60 has a "horizontal component" and a "vertical component." According to an experiment conducted by the inventor, the vertical component of the magnetic field serves to keep electrons in the region directly above the outer edge of the substrate 60. In order to provide a vertical component of sufficient intensity in the region directly above the outer edge of the substrate 60, X2+X3 in FIG. 4 must not be 0. In other words, a certain distance needs to be kept between the outer edge of the substrate 60 and the lead wire 18C in plan view. A sufficient vertical component may be provided by setting X2+X3 to, for example, on the order of 5 to 10 mm. Note that X3 is quite a small value and includes a slight difference depending on the substrate processing apparatus, and so X2 may be set to 5 to 10 mm.

The horizontal component of the magnetic field is a component in a direction opposite to the center of the substrate 60. That is, the horizontal component is a component in a negative x-axis direction on the left side of FIG. 4 and in a positive x-axis direction on the right side of FIG. 4. Since these horizontal components act in a direction in which the plasma 62 is widened, this is considered to contribute to applying uniform plasma processing to the substrate 60.

A lead wire may be provided on a side wall of the chamber 12 and a magnetic field may be formed in a region directly above the outer edge of the substrate 60 by using the lead wire. However, since the side face of the chamber 12 is distanced from the substrate 60, it is difficult to form a magnetic field of sufficient intensity in the region directly above the outer edge of the substrate 60. Although this problem may be solved by passing a high direct current through the lead wire, a temperature rise in the apparatus through which the high direct current flows may cause various harmful effects. In contrast, since the substrate processing apparatus 10 embeds the lead wire 18C in the ring-shaped part 18B of the shower plate 18, the distance between the lead wire 18C and the substrate 60 is small. It is thereby possible to form a magnetic field of sufficient intensity in the region directly above the outer edge of the substrate 60 without supplying a high direct current to the lead wire 18C.

The shower plate, the substrate processing apparatus and the method for processing a substrate according to some examples can be modified in various ways without losing features thereof. For example, processing contents of the substrate are not limited to film formation, but all kinds of processing using plasma may be adopted. The above-described specific numerical values are examples. The modifications described in the example are also applicable to shower plates, substrate processing apparatuses and methods for processing a substrate according to the following examples. Note that since the shower plates, substrate processing apparatuses and methods for processing a substrate according to the following examples have many points similar to those of the example described, the description will focus on differences from the example described.

Figure 6:
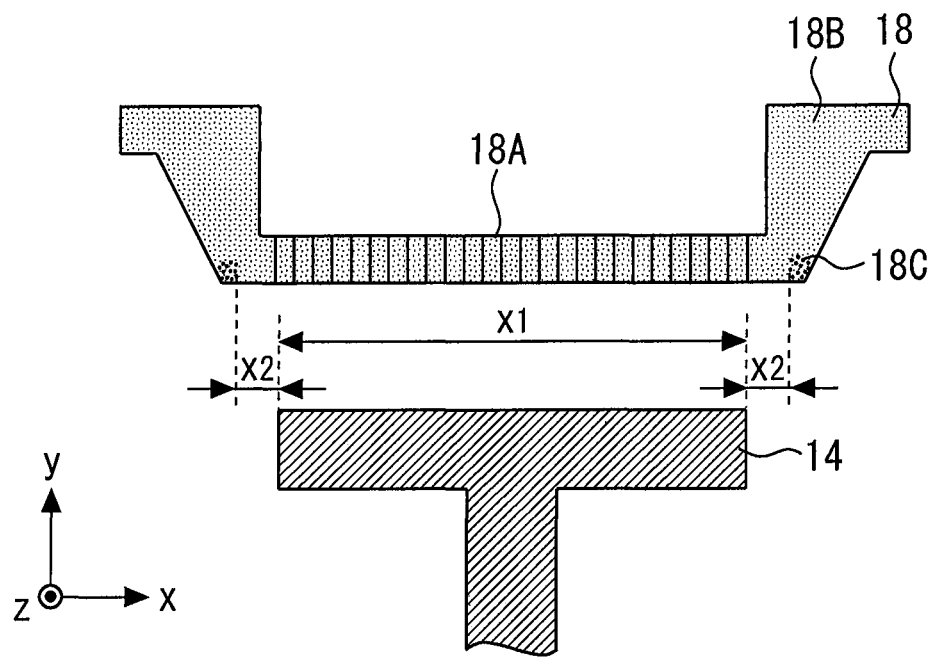
FIG. 6 is a cross-sectional view of the shower plate and the susceptor.

FIG. 6 is a cross-sectional view of the shower plate 18 and the susceptor 14 according to another example. A plurality of lead wires 18C are provided in a cross-sectional view. The number of windings of the lead wire 18C ranges 10 to 100, for example. One lead wire may be wound a plurality of times or a plurality of individual lead wires may be provided. A plurality of lead wires 18C appear in a cross-sectional view in all cases. When a plurality of lead wires 18C are provided, it is possible to form a magnetic field of sufficient intensity in a region directly above the outer edge of the substrate by passing a direct current of, for example, 10 to 100 mA through the respective lead wires in the plasma step. Providing a plurality of turns of the lead wire 18C makes it possible to reduce a direct current flowing through the lead wire 18C, and thereby prevent a temperature rise of the apparatus.

Figure 7:
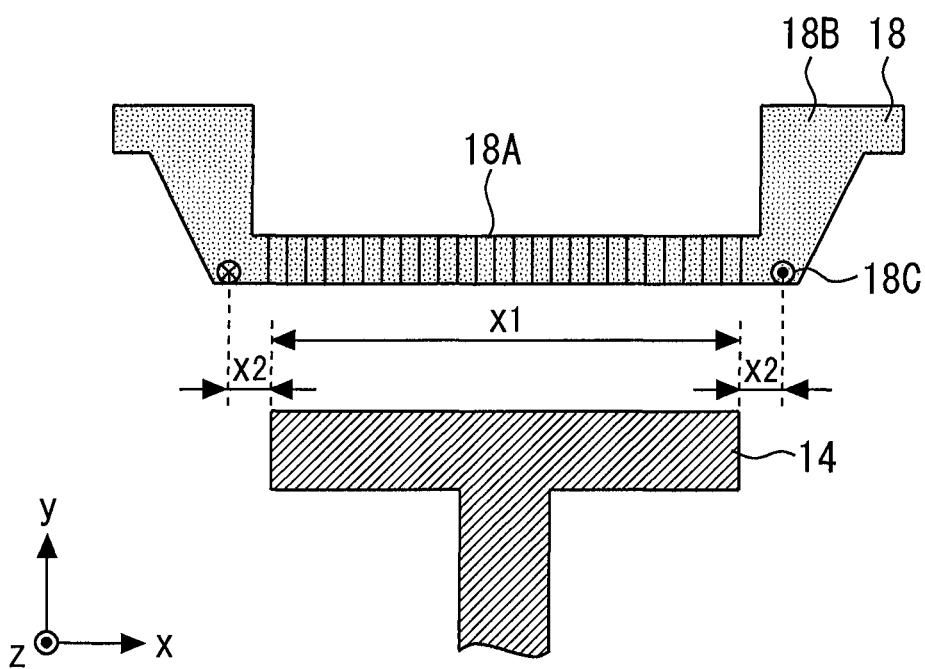
FIG. 7 is a cross-sectional view of the shower plate and the susceptor.

FIG. 7 is a cross-sectional view of the shower plate 18 and the susceptor 14 according to another example. The lead wire 18C is embedded in a bottom end portion of the ring-shaped part 18B. The "bottom end portion" of the ring-shaped part 18B is a region including the bottom end of the ring-shaped part 18B. Therefore, the lead wire 18C according to the example is located in a negative y-axis direction more than the lead wire 18C. Providing the lead wire 18C in the bottom end portion of the ring-shaped part 18B makes it possible to reduce the distance between the lead wire 18C and the substrate in the vertical direction while keeping the distance between the lead wire 18C and the substrate in the horizontal direction. Therefore, it is possible to supply a stronger magnetic field than that of the example of the FIG. 1 to the region directly above the outer edge of the substrate. Since the lead wire 18C is moved downward, it is possible to strengthen the vertical component of the magnetic field in the region directly above the outer edge of the substrate.

The plasma density in the region directly above the outer edge of the substrate has been studied in some examples. However, since there is not a substantial positional difference between the outer edge of the substrate and the outer edge of the susceptor, the same discussions as those described above will hold true even when the "region directly above the outer edge of the substrate" is read as the "region directly above the outer edge of the susceptor." Furthermore, the features described in some examples may be used in combination.

According to some examples, a direct current is made to flow through a lead wire provided in the shower plate and a magnetic field is formed in an outside part of plasma. It is thereby possible to apply uniform plasma processing to the substrate.

Obviously many modifications and variations of the examples are possible in the light of the above teachings.

Figure 8:
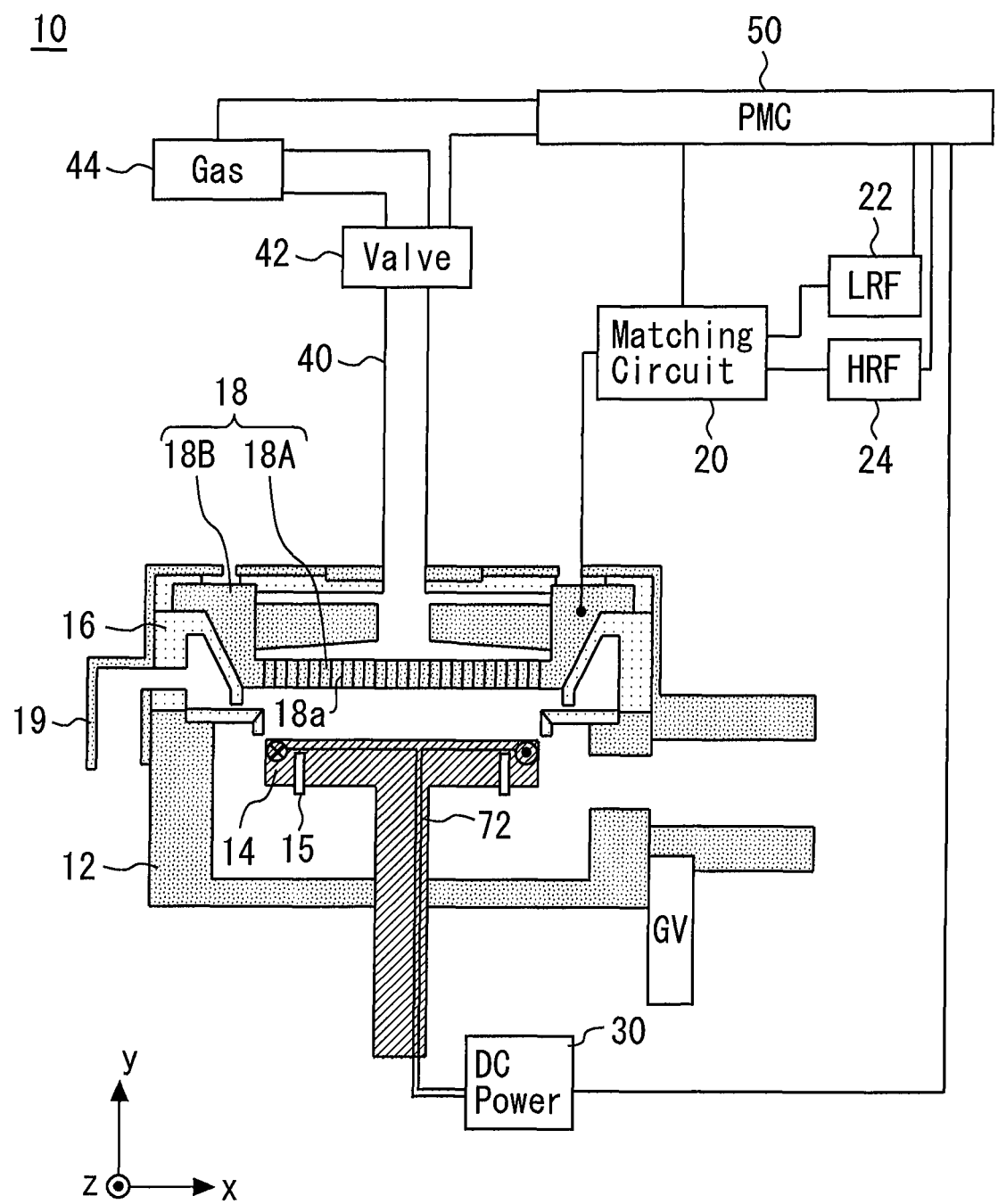
FIG. 8 is a diagram showing a substrate processing apparatus.

FIG. 8 is a diagram showing a substrate processing apparatus according to another example. A susceptor inner lead wire 72 is embedded in the susceptor 14. The susceptor inner lead wire 72 is connected to a DC power supply 30. The DC power supply 30 supplies a DC current to the susceptor inner lead wire 72.

Figure 9:
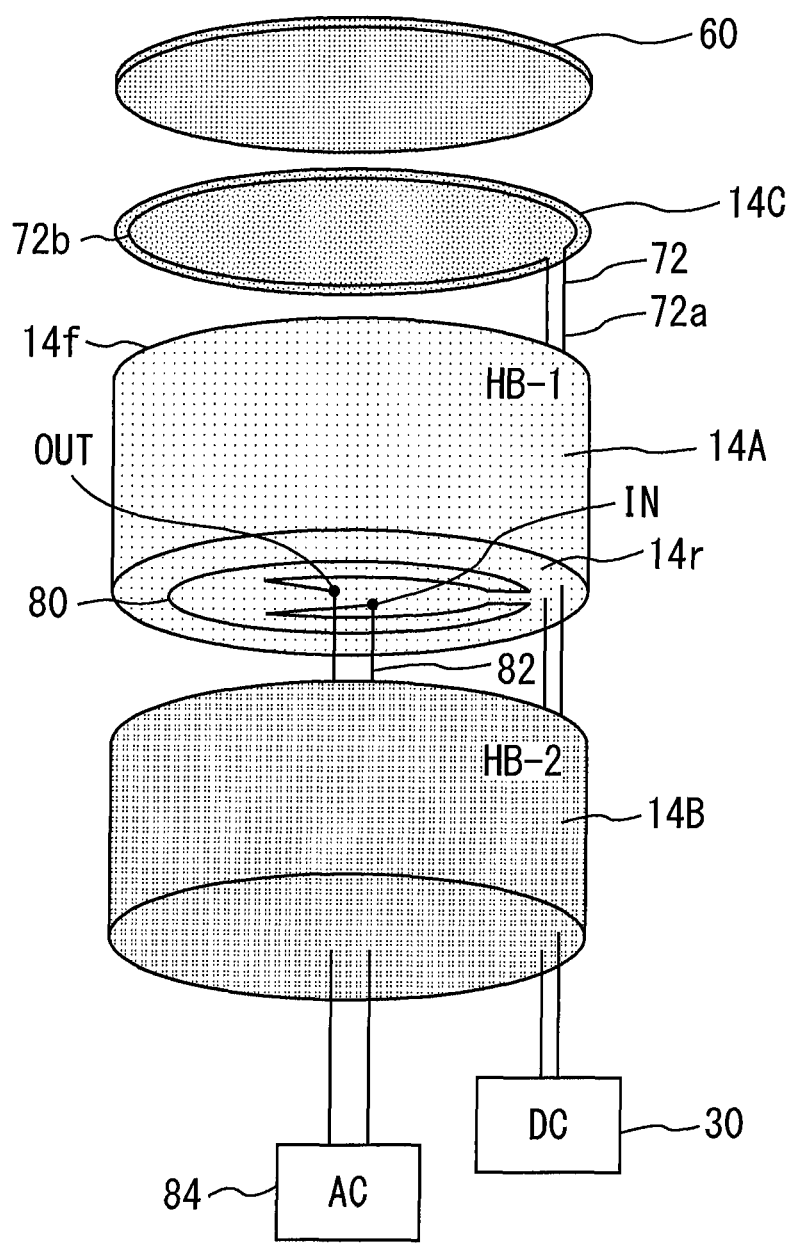
FIG. 9 is an exploded view of the susceptor and the periphery thereof.

FIG. 9 is an exploded view of the susceptor 14 of FIG. 8 and the periphery thereof. The susceptor 14 includes a heater block 14A, a heater block 14B provided under the heater block 14A, and an upper block 14C provided above the heater block 14A. For example, metal such as SUS may be used as the materials of the heater blocks 14A and 14B, and the upper block 14C. The upper block 14C is thinner than the heater blocks 14A and 14B. The susceptor may be configured as one united body, for example by welding the lower surface of the upper block 14C and the upper surface 14f of the heater block 14A to each other and welding the lower surface 14r of the heater block 14A and the upper surface of the heater block 14B to each other.

A substrate 60 to be mounted on the upper block 14C is provided above the upper block 14C. The substrate 60 is a wafer, for example.

The susceptor inner lead wire 72 includes a first part 72a and a second part 72b. The first part 72a penetrates through the heater blocks 14A and 14B, and is connected to the DC power supply 30. The second part 72b is connected to the first part 72a, and is provided between two heater blocks 14A, 14B and the upper block 14C. The second part 72b is provided to be ring-shaped in plan view along the outer edge of the susceptor.

A heater lead wire 80 is provided in the lower surface 14r of the heater block 14A. The heater lead wire 80 is embedded in the susceptor, for example by interposing the heater lead wire 80 between the heater block 14A and the heater block 14B. The heater block 14B covers the heater lead wire 80, whereby the heater lead wire 80 can be prevented from being exposed. The heater lead wire 80 is connected to an AC power supply 84 via a connection lead wire 82 penetrating through the heater block 14B. The AC power supply 84 supplies the heater lead wire 80 with an AC current, so that the heater lead wire 80 generates heat to increase the temperature of the susceptor 14 up to a predetermined temperature. The heater block 14A is provided with the heater lead wire 80, and the upper block 14C is provided with the second part 72b of the susceptor inner lead wire 72, thereby suppressing bidirectional interference of magnetic field caused by flow of current through these lead wires.

Figure 10:
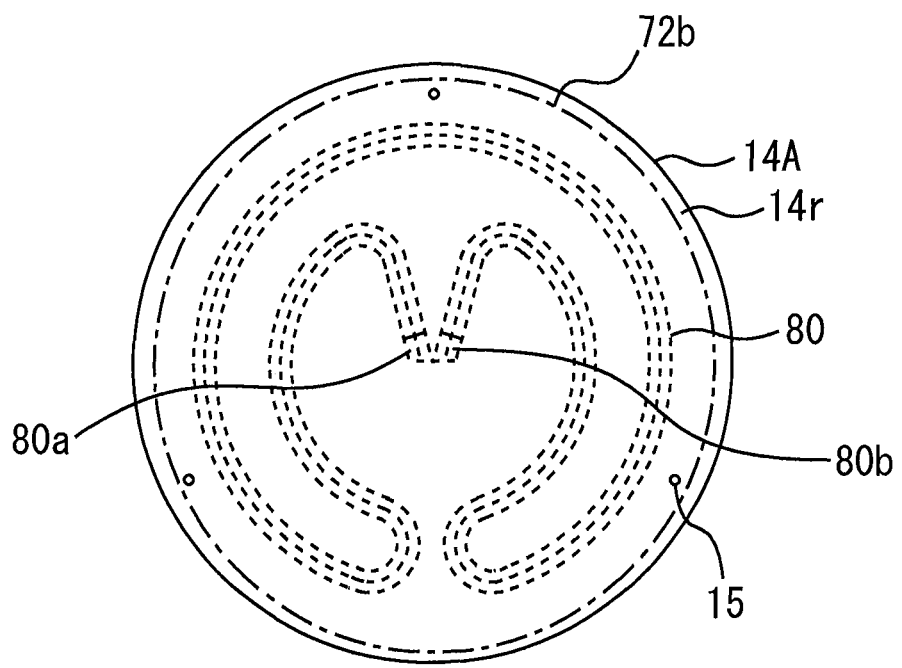
FIG. 10 is a plan view of the heater lead wire.

FIG. 10 is a plan view of the heater lead wire 80. The heater lead wire 80 has connection points 80a, 80b with the connection lead wire 82. The connection points 80a, 80b are located at the center of the heater block 14A. The heater lead wire 80 is shaped so as to pass from the connection point 80a through an outer portion of the heater block 14A and reach the connection point 80b.

A one-dotted chain line of FIG. 10 represents a plane position of the second part 72b of the susceptor inner lead wire 72. The second part 72b of the susceptor inner lead wire 72 is located outside beyond the portion where the heater lead wire 80 is provided. Therefore, the heater lead wire 80 is surrounded by the susceptor inner lead wire 72 in plan view.

A method of processing a substrate by the substrate processing apparatus exemplified in FIGS. 8 to 10 will be described. In a plasma step, a DC current is made to flow through the susceptor inner lead wire 72 to form magnetic field directly above the outer edge of the substrate 60. This magnetic field is different from magnetic field which occurs by making current flow through the lead wire 18C provided in the above-described shower plate 18. By making the DC current flow through the susceptor inner lead wire 72, magnetic field directing from the center side of the upper surface of the susceptor to the circumferential side of the upper surface is formed, and Lorentz force caused by the magnetic field and plasma electric field is generated. The Lorentz force captures electrons in plasma directly above the susceptor, and pulls the plasma to the circumferential portion as a whole, so that uniformity of the plasma can be enhanced. Therefore, according to the configuration of FIGS. 8 to 10, an effect of correcting the plasma may be obtained.

The temperature of the susceptor 14 is controlled by the current flowing through the heater lead wire 80. For example, current of 5 A and 100 W at 50 or 60 kHz is made to flow through the heater lead wire 80. When a large DC current is made to flow through the susceptor inner lead wire 72, there is a risk that the temperature distribution of the susceptor 14 may become an unintended temperature distribution by the influence of the large DC current. Therefore, a relatively small current is made to flow through the susceptor inner lead wire 72.

It is considered that the magnetic field occurring directly above the outer edge of the substrate 60 due to flow of a relatively small DC current through the susceptor inner lead wire 72 does not greatly change the center portion of the plasma, but traps the plasma in the neighborhood of the susceptor inner lead wire 72. It is considered that provision of the magnetic field as described above is suitable for correcting a problem that the plasma density is reduced only on the periphery of the plasma, for example.

When the wiring shape of the heater lead wire 80 is directly reflected in the temperature distribution of the upper surface of the susceptor, it would be impossible to uniformly heat the substrate 60. Accordingly, when it is intended to uniformly heat the substrate 60, the thickness of the heater block 14A is increased to some extent. In this case, the phenomenon that the shape of the heater lead wire 80 is directly reflected in the heat distribution of the substrate 60 may be avoided, so that the substrate 60 can be generally uniformly heated. Provision of the upper block 14C means that the distance between the heater lead wire 80 and the substrate 60 is increased, and it contributes to provision of the susceptor inner lead wire 72 at a position close to the substrate 60. Furthermore, since the second part 72b of the susceptor inner lead wire 72 is provided along the outer edge of the susceptor, it does not greatly influence the temperature at the center of the susceptor.

Figure 11:
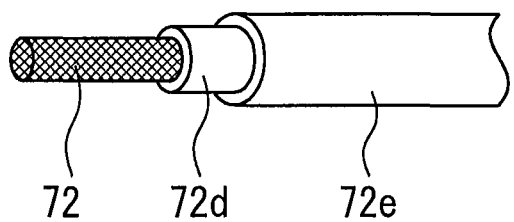
FIG. 11 is a diagram showing the susceptor inner lead wire and a cover therefor.

FIG. 11 is a diagram showing the susceptor inner lead wire 72 and a cover therefor. Since the heat resisting temperature of a cover for a general lead wire generally ranges from 180° C. to 200° C., a dielectric-breakdown risk of the cover occurs when the temperature of the susceptor is increased to 200° C. or more. Therefore, in a case where the temperature of the susceptor is assumed to increase, a cover which covers the susceptor inner lead wire 72 and has heat resistance to the temperature of 500° C. or more may be provided. For example, the susceptor inner lead wire 72 can be covered with an insulator 72d, and the insulator 72d can be covered with siliglass braid 72e.

Figure 12:
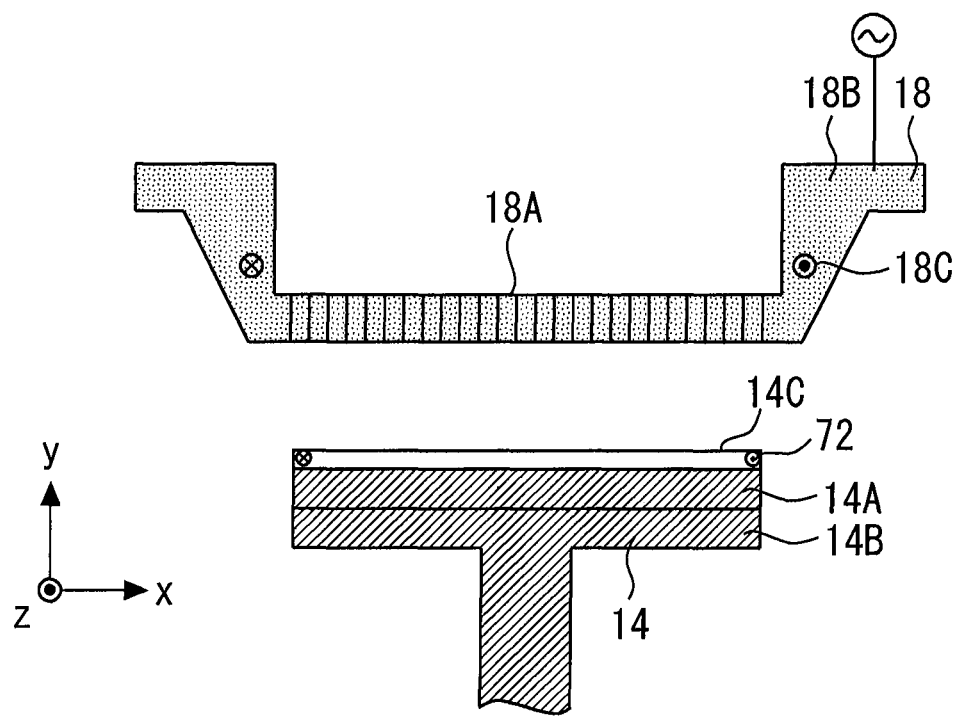
FIG. 12 is a detailed diagram showing a substrate processing apparatus and wiring location.

FIG. 12 is a diagram showing a substrate processing apparatus and wiring location according to another example. This substrate processing apparatus includes a lead wire 18C embedded in a shower plate 18, and a susceptor inner lead wire 72 embedded in the susceptor 14. According to this substrate processing apparatus, by making a DC current flow through the lead wire 18C or the susceptor inner lead wire 72 in the plasma step, magnetic field may be formed directly above the outer edge of the substrate. The DC current may be made to flow through both the lead wire 18C and the susceptor inner lead wire 72 at the same time. For example, the DC current may be supplied to both the lead wire 18C and the susceptor inner lead wire 72 by one DC power supply 30 shown in FIG. 8. A DC current may be supplied from the DC power supply 30 to the susceptor inner lead wire 72 while a DC current is supplied from another DC power supply to the lead wire 18C. A current smaller than the current to flow through the lead wire 18C is made to flow through the susceptor inner lead wire 72, whereby the temperature increase of the susceptor may be suppressed and magnetic field may be confined only on the periphery of the susceptor.

As described above, the substrate processing apparatus including the lead wire provided in the shower plate exemplified in FIGS. 1 to 7 and the susceptor inner lead wire 72 provided in the susceptor exemplified in FIGS. 8 to 11 can be provided, thereby making it possible to adjust the plasma distribution roughly by the magnetic field of the shower plate and finely by that of the susceptor.

The substrate processing apparatuses which have been exemplified above may be used as a PE-CVD (Plasma-Enhanced CVD) apparatus or a PE-ALD (Plasma-Enhanced ALD) apparatus. The substrate processing apparatuses which have been exemplified above may enhance the uniformity of the plasma distribution and make it possible to perform uniform processing on a substrate. Specifically, the substrate processing apparatuses may contribute to uniformity in film thickness, film quality, or film coverage for a variable kinds of structures.

What is claimed is:

1. A substrate processing apparatus comprising:
   a chamber;
   a susceptor provided in the chamber;
   a shower plate comprising a plate part provided with a plurality of through holes and formed of a conductor, a ring-shaped part connected to an outer edge of the plate part, surrounding the plate part and formed of a conductor and a lead wire embedded in the ring-shaped part and surrounding the plate part and the susceptor in plan view, the shower plate being provided so as to face the susceptor in the chamber; and
   a DC power supply that supplies a direct current to the lead wire.

2. The substrate processing apparatus according to claim 1, further comprising a high frequency power supply that provides RF power to the plate part and the ring-shaped part.

3. The substrate processing apparatus according to claim 1, wherein the lead wire is located 5 to 10 mm outside an outer edge of the susceptor.

4. The substrate processing apparatus according to claim 1, wherein the lead wire is provided in plurality.

5. The substrate processing apparatus according to claim 1, wherein the lead wire is embedded in a bottom end portion of the ring-shaped part.

6. The substrate processing apparatus according to claim 1, wherein the lead wire is covered with an insulating coat and thereby electrically insulated from the ring-shaped part.

* * * * *